United States Patent
Lee et al.

(10) Patent No.: US 6,935,410 B2
(45) Date of Patent: Aug. 30, 2005

(54) HEAT SINK ASSEMBLY

(75) Inventors: Hsieh Kun Lee, Tu-chen (TW); Cheng-Tien Lai, Tu-chen (TW); Shi Wen Zhou, Shenzhen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/749,889

(22) Filed: Dec. 31, 2003

(65) Prior Publication Data

US 2004/0194926 A1 Oct. 7, 2004

(30) Foreign Application Priority Data

Dec. 31, 2002 (TW) ....................................... 91221600 U

(51) Int. Cl.[7] ................................................. F28F 3/00
(52) U.S. Cl. ..................................... 165/80.3; 165/80.1
(58) Field of Search ............................... 165/80.1–80.5; 361/704–711

(56) References Cited

U.S. PATENT DOCUMENTS

| | | | |
|---|---|---|---|
| 5,495,392 A | | 2/1996 | Shen |
| 5,724,228 A | | 3/1998 | Lee |
| 5,828,550 A | | 10/1998 | Horng |
| 5,943,209 A | * | 8/1999 | Liu .............................. 361/695 |
| 6,017,185 A | | 1/2000 | Kuo |
| 6,236,569 B1 | * | 5/2001 | McEuen ...................... 361/719 |
| 6,332,251 B1 | * | 12/2001 | Ho et al. ....................... 24/459 |
| 6,404,633 B1 | * | 6/2002 | Hsu ............................. 361/703 |
| 6,449,152 B1 | * | 9/2002 | Lin .............................. 361/697 |
| 6,643,133 B1 | * | 11/2003 | Liu .............................. 361/704 |
| 6,771,506 B2 | * | 8/2004 | Lee et al. .................... 361/704 |

FOREIGN PATENT DOCUMENTS

| | | |
|---|---|---|
| TW | 246209 | 4/1995 |
| TW | 370209 | 9/1999 |
| TW | 430086 | 4/2001 |

\* cited by examiner

*Primary Examiner*—Teresa J. Walberg
(74) *Attorney, Agent, or Firm*—Wei Te Chung

(57) ABSTRACT

A heat sink assembly includes a fan (10), a heat sink (20) and a mounting device (50). The heat sink includes a base (22) and plural of fins (24) extending upwardly from the base. Plural of claws (26) are formed in a top end of one fin which extends from a side of the base. A locking hole (30) is defined in another fin which extends from an opposite side of the base. A vent (52) is defined in the center of the mounting device, and four fixing holes (54) are defined in four corners of the mounting device for engaging with four screws (14) which extend through the fan to the mounting device. Plural of pivots (56) are provided in a first side of the mounting device for pivotably received in the claws of the heat sink thereby pivotably attaching the mounting device to the heat sink. A hook (62) is provided in an opposite side of the mounting device for engaging with the locking hole of the heat sink thereby fixing the mounting device to the heat sink.

18 Claims, 3 Drawing Sheets

HEAT SINK ASSEMBLY

BACKGROUND OF THE INVENTION

1. Field of the Invention

The present invention relates generally to heat sink assemblies, and in particular to a heat sink assembly incorporating a fan which is releasably attached to a heat sink.

2. Prior Art

Developments in today's highly information-intensive society have led to remarkable improvements in performances of electronic devices. During operation of many contemporary electronic devices, large amounts of heat are produced. Such heat must be efficiently removed from the electronic device, to prevent the system from becoming unstable. Typically, a heat sink is attached to an outer surface of the device to facilitate removal of heat therefrom. A fan is often attached to the heat sink to provide forced air convection therefrom.

FIG. 3 shows a conventional heat sink assembly, which includes a heat sink 70 and a fan 80. A plurality of fins 74 extends upwardly from a base 72 of the heat sink 70. The fan 80 is essentially a rectangular box, with a through hole defined in the vicinity of each corner thereof. In assembly, a tool such as a screwdriver (not shown) must be used to drive screws 76 through the corresponding through holes such that screws 76 engage with the fins 74 of the heat sink 70. Some fastening means (not shown, for example a clip, fastening screws etc) are received under the fan 80 for fixing the heat sink 70 to a top surface of a CPU. However, when a user needs to drive the fastening screws to attach the heat sink assembly to a computer or replace the clip, it is often required to detach the fan 80 from the heat sink 70. It is inconvenient to draw the screws for detaching the fan 80 from the heat sink 70. Furthermore, there is an industry trend whereby the fins 74 are being made thinner and thinner. Thus the fins 74 are more frequently being distorted or even damaged when the screws 76 are engaged therewith.

SUMMARY OF THE INVENTION

Accordingly, an object of the present invention is to provide a heat sink assembly incorporating a mounting device which can releasably attach a fan to a heat sink.

To achieve the above-mentioned object, a heat sink assembly in accordance with a preferred embodiment of the present invention comprises a fan, a heat sink and a mounting device. The heat sink includes a base and plural of fins extending upwardly from the base. Plural of claws are formed in a top end of one fin which extends from a side of the base. A locking hole is defined in another fin which extends from an opposite side of the base. A vent is defined in a center of the mounting device, and four fixing holes are defined in four corners of the mounting device for engaging with four screws which extend through the fan to the mounting device. Plural of pivots are provided in a first side of the mounting device for pivotably received in the claw of the heat sink thereby pivotably attaching the mounting device to the heat sink. A hook is provided in an opposite side of the mounting device for engaging with the locking hole of the heat sink thereby releasably fixing the mounting device to the heat sink.

Other objects, advantages and novel features of the present invention will be drawn from the following detailed description of preferred embodiments of the present invention with attached drawings, in which:

DESCRIPTION OF THE PREFERRED EMBODIMENTS

Figure 1:
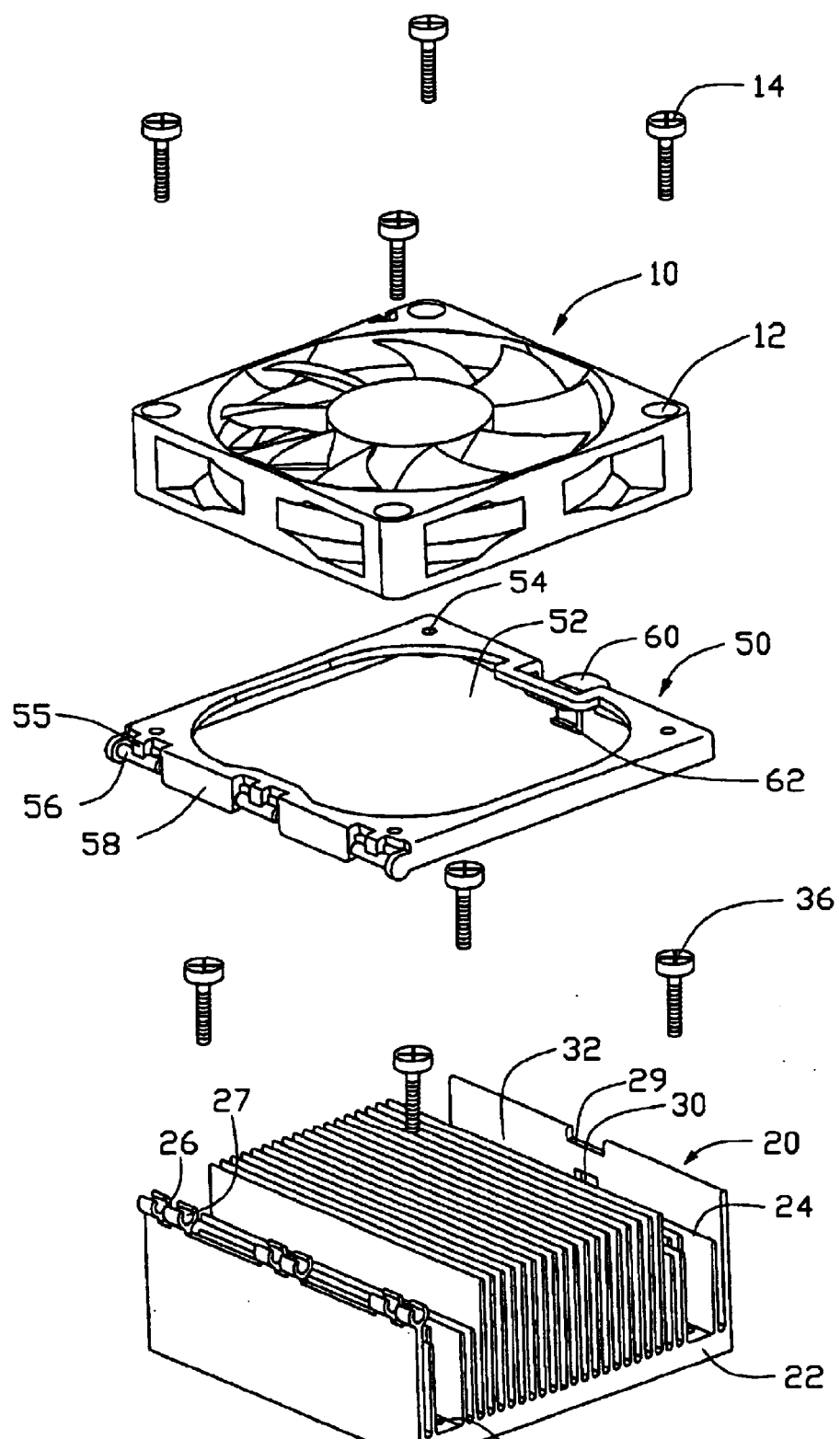
FIG. 1 is an exploded, isometric view of a heat sink assembly in accordance with the preferred embodiment of the present invention.

Referring to FIG. 1, a heat sink assembly in accordance with the preferred embodiment of the present invention comprises a fan 10, a heat sink 20, and a mounting device 50.

The fan 10 is generally box-shaped, and has a through hole 12 defined at each of four corners thereof. Plural of screws 14 are for extending through the through holes 12 of the fan 10 to engage with the mounting device 50 respectively.

The heat sink 20 includes a base 22 and plural of fins 24 extending upwardly from the base 22. Three pairs of claws 26 are spaced formed in a top end of one fin 24 which extends upwardly from a side of the base 22. The claw 26 is in a "U" shape, and a pivot hole 27 is defined therein. An opening 29 and a locking hole 30 are defined in another fin 24 which extends from an opposite side of the base 22. Four fastening holes 34 are defined in the vicinity of four corners of the base 22. Four fastening screws 36 are for extending through the fastening holes 34 of the heat sink 20 respectively, for fastening the heat sink 20 to a motherboard (not shown). Wherein the fins 24 lies in a middle portion of the base 22 are higher than the fins 24 lies in two sides of the base 22, thus two grooves 32 are formed in a top of the heat sink 20. The grooves 32 can receive a clip (not shown) therein respectively, for fastening the heat sink 20 to the motherboard.

The mounting device 50 is rectangular shape. A vent 52 is defined in a center of the mounting device 50, for providing airflow access for the fan 10. Four fixing holes 54 are defined in four corners of the mounting device 50, for engaging with the screws 14 which extend through the fan 10 to the mounting device 50 respectively. Plural of connection portions 55 and blocks 58 alternatively depend from a first side of the mounting device 50. A pivot 56 extends perpendicularly from a distal end of the connection portion 55, wherein the pivots 56 can be pivotably received in the pivot holes 27 of the heat sink 20 respectively thereby pivotably attaching the mounting device 50 to the heat sink 20. The blocks 58 can be fitted into the spaces between two pairs of claws 26, for preventing the pivots 56 sliding in the pivot holes 27. A handle 60 is provided in a second opposite side of the mounting device 50 opposing the first side. A hook 62 extends downwardly from a bottom of the handle 60, for engaging with the locking hole 30 of the heat sink 20 thereby fixing the mounting device 50 to the heat sink 20.

Figure 2:
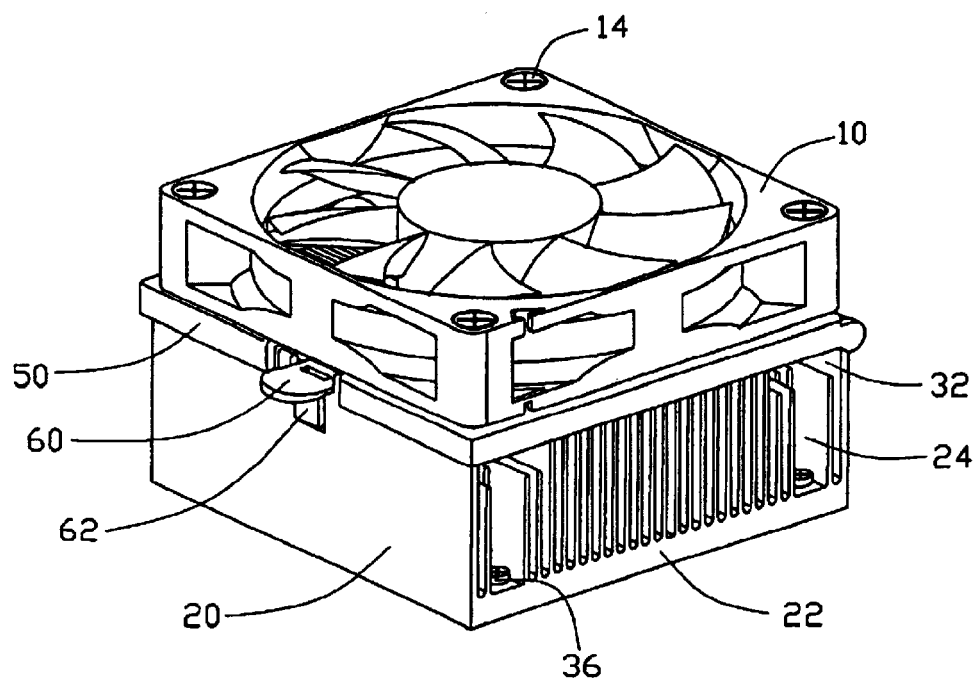
FIG. 2 is an assembled view of FIG. 1.
Figure 3:
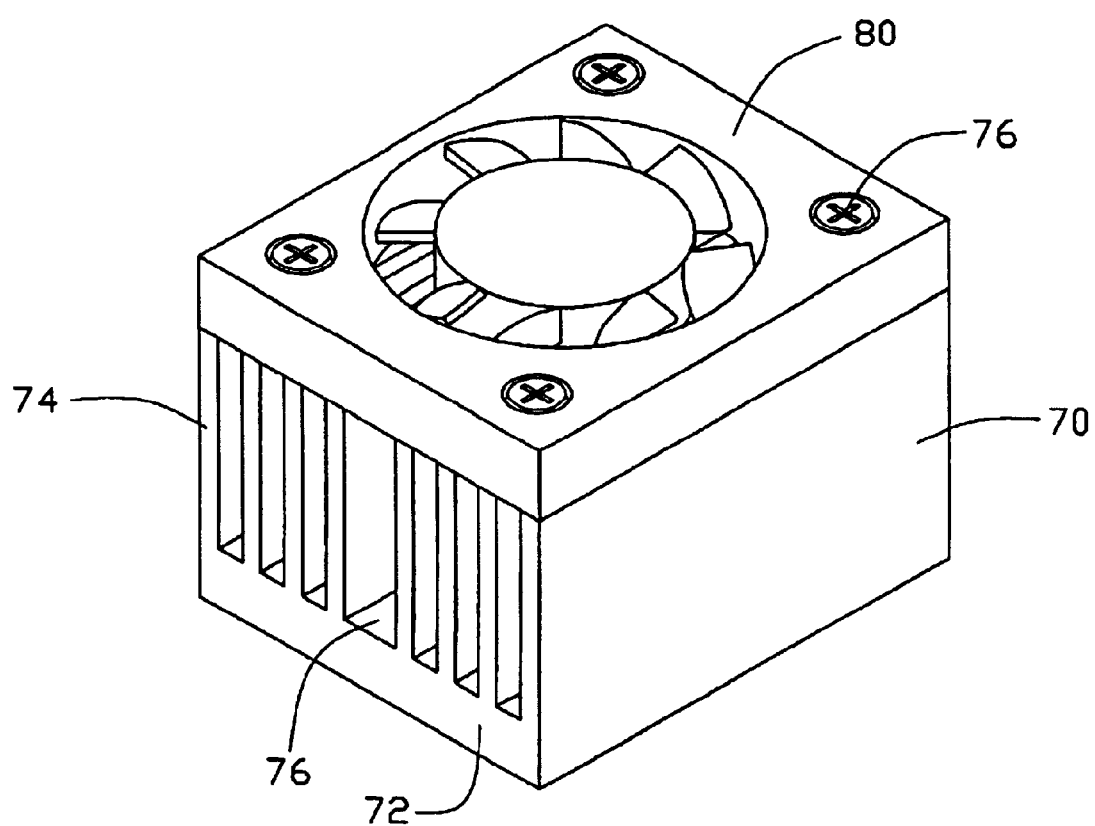
FIG. 3 is an assembled view of a conventional heat sink assembly.

Referring to FIG. 2, in assembly, the fastening screws 36 are extended through the fastening holes 34 of the heat sink 20. The screws 14 are extended through the through holes 12 of the fan 10 to engage in the fixing holes 54 of the mounting device 50 respectively. The fan 10 is thus attached to the mounting devices 50. The pivots 56 of the mounting device 50 are then pivotably inserted into the pivot holes 27 of the heat sink 20. The hook 62 is releasably engaged in the locking hole 30 of the heat sink 20. Thus the combined fan 10 and mounting device 50 is attached to the heat sink 20.

In an alternative embodiment of the present invention, the hook 62 of the mounting device 50 and the locking hole 30 of the heat sink 20 can be replaced with a clasp(not shown) formed in a top end of the another fin 24 which extends from the opposite side of the base 22. The clasp can engage with the periphery of the mounting device 50, for fixing the mounting device 50 to the heat sink 20.

In the present invention, it is ready for a user to operate on the handle 60 to unlock the hook 62 from the locking hole 30, and rotate the mounting device 50 about the pivots 56 to thereby allow the user to change the clip (not shown) received in the groove 32 or drive the fastening screws 36 for fastening the heat sink 20 to the motherboard. It is also very convenient to re-fixing the mounting device 50 to the heat sink 20. Furthermore, the screws which are used to fasten the fan to the heat sink in the prior art are not required. Accordingly, the fins of the heat sink are not distorted as in the prior art.

It is understood that the invention may be embodied in other forms without departing from the spirit thereof. Thus, the present example and embodiments are to be considered in all respects as illustrative and not restrictive, and the invention is not to be limited to the details given herein.

What is claimed is:

1. A heat sink assembly for an electronic device comprising:
    a heat sink comprising a base and plural fins extending upwardly from the base, plural claws formed in one end of one fin which extends from a first side of the base, an engaging member provided in a second side of the beat sink;
    a fan;
    a mounting device for mounting the fan to the heat sink, the mounting device comprising plural of pivots provided in a first side thereof, a vent defined in a center thereof, an engaging portion provided in a second side thereof, and
    plural means for locking the fan to the mounting device;
    wherein the pivots are pivotably received in the claws of the heat sink respectively and the engaging portion releasably engages with the engaging member of the heat sink, and the vent is located below the fan.

2. The heat sink assembly as described in claim 1, wherein the fins lying in a middle portion of the base are higher than the fins lying in the first and second sides of the base, and two grooves are thus formed in a top of the heat sink for receiving two clips therein.

3. The heat sink assembly as described in claim 1, wherein the engaging member of the heat sink is a locking hole defined in another fin which extends from a second side of the base.

4. The heat sink assembly as described in claim 3, wherein the engaging member of the heat sink is a hook received in the locking hole of the heat sink, for releasably fixing the mounting device to the heat sink.

5. The heat sink assembly as described in claim 4, wherein a handle is provided in the second side of the mounting device connected the hook for facilitating to release the hook from the locking hole.

6. The heat sink assembly as described in claim 1, wherein plural connection portions extend from a first side of the mounting device, wherein the pivots extend perpendicularly from a distal end of the connection portion.

7. The heat sink assembly as described in claim 6, wherein the claws are "U" shaped, a pivot hole is defined in each claw, and the pivots are pivotably received in the pivot holes respectively.

8. The heat sink assembly as described in claim 7, where plural spaced blocks extend from the first side of the mounting device, and the blocks can be fit into spaces between the claws, for preventing the pivots sliding in the pivot holes.

9. The heat sink assembly as described in claim 1, wherein the locking means comprises four fixing holes provided in four corners of the mounting device, four through holes defined in four corners of the fan, and four screws which extend through the through holes to engage in the fixing holes of the mounting device respectively.

10. The heat sink assembly as described in claim 1, wherein four fastening holes are defined in the base, and four fastening screws extend through the fastening holes of the base respectively, for fastening the heat sink to an electronic device.

11. A heat sink assembly comprising:
    a heat sink comprising a base and plural of fins extending upwardly from the base;
    a fan; and
    a mounting device fixedly attached to the fan and pivotably attached to the heat sink, the mounting device comprising a locking means provided in a first side thereof and releasably locking with the beat sink, wherein
    when the locking means is freed from the heat sink, the combined fan and mounting device can pivot about a second side of the heat sink.

12. The heat sink assembly as described in claim 11, wherein plural of claws are provided in a top end of one fin which extends from the second side of the base, and each claws defines a pivot hole.

13. The hear sink assembly as described in claim 12, wherein plural pivots are provide in the second side of the mounting device, wherein the pivots can be pivotably received in the pivot holes of the heat sink respectively.

14. The heat sink assembly as described in claim 11, wherein the locking means of the mounting device is a hook.

15. The heat sink assembly as described in claim 14, wherein a locking hole is defined in the heat sink, and the hook of the mounting device can releasably locking with the locking hole of the heat sink.

16. A heat sink assembly comprising:
    a heat sink defining a base with a plurality of fins disposed thereon wherein two opposite first and second side fins respectively are equipped with a pivotal device and a latching device; and
    a mounting device positioned above said fins and oppositely defining a hook and a pivot respectively attached to said latching device and said pivotal device wherein said hook is releasable from said latching device to have said mounting device pivotally moveable relative to the heat sink.

17. The heat sink assembly as described in claim 16, wherein a fan is fastened upon the mounting device.

18. The heat sink assembly as described in claim 17, wherein said mounting device defines a vent for communicating said fan with the fins.

* * * * *